United States Patent [19]

Fasang et al.

[11] Patent Number: 5,138,619
[45] Date of Patent: Aug. 11, 1992

[54] BUILT-IN SELF TEST FOR INTEGRATED CIRCUIT MEMORY

[75] Inventors: Patrick P. Fasang, Saratoga; Walter F. Bridgewater, San Jose, both of Calif.

[73] Assignee: National Semiconductor Corporation, Santa Clara, Calif.

[21] Appl. No.: 480,703

[22] Filed: Feb. 15, 1990

[51] Int. Cl.$^5$ .............................................. G11C 29/00
[52] U.S. Cl. .................. 371/21.1; 371/22.5; 371/21.2; 371/27
[58] Field of Search ............. 371/21.1, 22.5, 21.2, 371/22.4, 27, 25.1

[56] References Cited

U.S. PATENT DOCUMENTS

| | | | |
|---|---|---|---|
| 4,195,770 | 4/1980 | Benton et al. | 371/21.2 |
| 4,369,511 | 1/1983 | Kimura et al. | 371/27 |
| 4,370,746 | 1/1983 | Jones et al. | 371/27 |
| 4,433,413 | 2/1984 | Fasang | 371/25 |
| 4,608,683 | 8/1986 | Shigaki | 371/25.1 |
| 4,782,487 | 11/1988 | Smelser | 371/27 |
| 4,783,785 | 11/1988 | Hanta | 371/25.1 |
| 4,788,684 | 11/1988 | Kawaguchi et al. | 371/21.2 |
| 4,835,774 | 5/1989 | Ooshima et al. | 371/25.1 |
| 4,876,685 | 10/1989 | Rich | 371/21.6 |
| 4,888,772 | 12/1989 | Tanigawa | 371/21.2 |
| 4,903,266 | 2/1990 | Hack | 371/21.2 |

OTHER PUBLICATIONS

AT&T, Parameterized Macrocells Data Sheet, RAMS-1AT, pp. 8-22-8-27.
AT&T, Parameterized Macrocells Data Sheet, RAMS1CT, pp. 8-36-8-41.
Abadir & Reghbati, "Functional testing of semiconductor random access memories," Computing Surveys, vol. 15, No. 3, Sep. 1983, pp. 118-139.
Electronic Engineering Times, "European Silicon Turns to Big Chip," Jan. 8, 1990.
Nadeau-Dostie et al., "A serial interfacing technique for built-in and external testing for embedded memories," IEEE Custom Integrated Circuits Conference, 1989, pp. 22.2.1-22.2.5.
National Semiconductor Corporation, ASIC Design Manual, No. 400010, Rev. 1, various pages.
National Semiconductor Corporation, CMOS Logic Databook, No. 400039, Rev. 1, pp. 3-142-3-146.
Scholz et al., "ASIC implementation of boundary-scan and built-in self-test (BIST)," Journal of Semicustom ICs, vol. 6, No. 4, pp. 30-37.

*Primary Examiner*—Jerry Smith
*Assistant Examiner*—Ly V. Hua
*Attorney, Agent, or Firm*—Skjerven, Morrill, MacPherson, Franklin & Friel

[57] ABSTRACT

In a built-in self test ("BIST") circuit for on-chip testing of an integrated circuit memory, a control logic circuit is responsive to an external signal on a test select pin for controlling the BIST operations of the major circuit groups thereof. The major circuit groups include an address PRPG (pseudo-random pattern generator), which selectively furnishes test addresses or mission addresses to the memory; a data PRPG, which selectively furnishes test data or mission data to the memory; a PSA (parallel signature analyzer) PRPG, which furnishes mission data from the memory in normal mode and determines a signature in test mode; and a decoder, which compares the signature determined by the PSA PRPG with a known correct signature and sets a flag to indicate memory pass/fail. The BIST circuit is modular and extendable for any N-word by M-bit memory. To this end, a counter in the control logic circuit comprises a plurality of counter slices, the address PRPG comprises a plurality of address slices, the data PRPG comprises a plurality of data slices, and the PSA PRPG comprises a plurality of PSA slices. The BIST circuit is formed by replicating slices for the major circuit groups. Only certain feedback paths in the major circuit groups and certain control signal combinatorial circuits in the control logic require customization.

15 Claims, 14 Drawing Sheets

BUILT-IN SELF TEST FOR INTEGRATED CIRCUIT MEMORY

BACKGROUND OF THE INVENTION

1. Field of the Invention

The present invention relates to built-in self test for integrated circuits, and more particularly to on-chip techniques for testing random access memories embedded in application specific integrated circuits.

2. Description of Related Art

The functional testing of random access memory ("RAM") requires a large number of test vectors. Compared with random logic, for example, the functional testing of RAM requires more test vectors because RAM has more possible types of faults than random logic. When embedded RAM in an application specific integrated circuit ("ASIC") is to be tested, one must consider what test patterns should be used for testing the RAM, and how to gain access to the RAM itself.

If the architecture of the ASIC includes a bus that is accessible from the ASIC pins, the issue of access is eliminated and any one of many generally known test patterns and techniques may be used in testing the embedded RAM. For example, some suitable techniques and procedures are described in Abadir and Reghbati, "Functional Testing of Semiconductor Random Access Memories," *Computing Surveys*, Vol. 15, No. 3, Sep. 1983, pp. 175-98.

Special techniques must be used to functionally test embedded RAM if the architecture of the ASIC does not provide access to the RAM bus from the pins of the chip. One such technique is built-in self test ("BIST"), an example of which is described generally in Scholz et al., "ASIC Implementations of Boundary-Scan and Built-In Self-Test," *Journal of Semicustom ICs*, Vol. 6, No. 4, 1989, pp. 30-37 Another BIST technique described in Nadeau-Dostie et al., "A Serial Interfacing Technique for Built-In and External Testing of Embedded Memories," *Proceedings of the IEEE 1989 Custom Integrated Circuits Conference*, 1989, pp. 22.2.1-22.2.5, uses the serial application of externally generated test vectors A BIST technique for testing the overall functional operation of a microprocessor system which includes RAM and PROM (programmable read only memory) is described in U.S. Pat. No. 4,433,413, issued Feb. 21, 1984 to Fasang. The technique incorporates a pseudo-random pattern generator ("PRPG"), a signature register ("SR"), supplemental control logic, serial and parallel I/O port test logic, and a LED display into the microprocessor system. Test instructions are provided in the system PROM, while test input data is provided by the test instructions and the PRPG. Test output data is processed by the SR and the system microprocessor, and the results of the test are presented on the LED display.

SUMMARY OF THE INVENTION

The present invention offers a number of advantages over the prior art. The BIST technique of the present invention is stand-alone, requiring no external circuitry for generating the test patterns. Moreover, the number of BIST pins to be added to the integrated circuit are minimized.

RAMs with BIST in accordance with the present invention are modular and extendable for any N-word by M-bit RAM and for a wide variety of customer requirements. Accordingly, RAM with BIST circuits are readily generated either manually or with computer software tools, in accordance with the customer's RAM specification and without imposing on the customer the need to comprehend BIST. Hence, the integration of customer application specific circuits including RAM on the same ASIC chip is readily accommodated.

In one embodiment of the present invention, a built-in self test ("BIST") circuit for integrated circuit memory includes a control logic circuit, which is responsive to a test select signal and the state of a counter therein for controlling the operation of an address PRPG, a data PRPG, a PSA PRPG, and a decoder. The counter has a plurality of counter slices forming the respective stages thereof, and is responsive to a clock signal to count clock cycles. The address PRPG has a plurality of address slices forming the respective serially-connected stages thereof, and the respective outputs of the stages are furnished as address bits to the memory. The data PRPG has a plurality of data slices forming the respective serially-connected stages thereof, and the respective outputs of the stages are furnished as data bits to the memory. The PSA PRPG, which determines a signature, has a plurality of PSA slices forming the respective stages thereof, and receives on respective inputs of the stages test data from the memory. The signature determined by the PSA PRPG is compared with a known correct signature in a decoder, which sets a flag to indicate memory pass/fail.

In one variation of the BIST circuit, the control logic generates a pattern control bit signal PCB to which the data PRPG is responsive for determining upon reset/initialization the application to the data PRPG of a seed number that is either a preselected number or the complement of the preselected number. In a further variation, the control logic generates a read/write signal RW for controlling first write and read cycles and second write and read cycles. In this event, the PCB signal determines the application of a preselected number at the start of the first write cycle, and the application of the complement of the preselected number at the start of the second write cycle.

In another embodiment of the present invention, the built-in self test circuit for integrated circuit memory is formed in a number of steps that include replicating a counter slice a selected number of times, replicating an address slice a selected number of times, replicating a data slice a selected number of times, and replicating a PSA slice a selected number of times The replicated counter slices are connected by means of their register carry outputs. The replicated address slices are serially connected to form an address PRPG, and form the respective stages thereof and provide address bits to the memory on their respective outputs. The replicated data slices are connected in similar fashion to provide data bits to the memory on their respective outputs. The replicated PSA slices are serially connected to form a PSA PRPG, and receive test data from the memory at their respective inputs and providing signature bits on their respective outputs. A decoder is provided for comparing the signature bits with a known correct signature to determine memory pass/fail.

BRIEF DESCRIPTION OF THE DRAWINGS

In the Figures, where like reference numerals indicate like parts.

DETAILED DESCRIPTION OF THE PREFERRED EMBODIMENT

Figure 1:
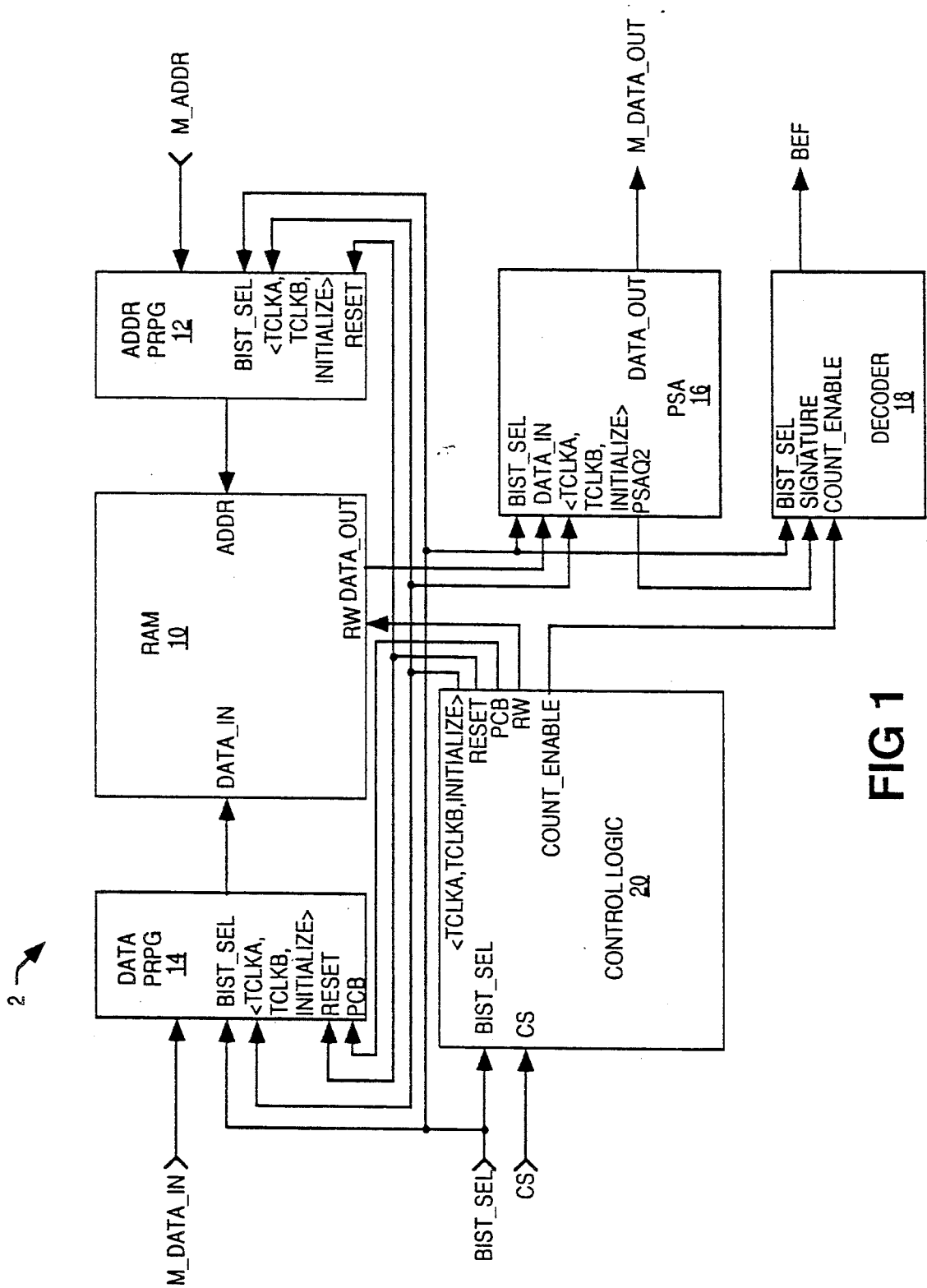
FIG. 1 is a block schematic diagram of a RAM with BIST.

The architecture of RAM with BIST 2 is illustrated in FIG. 1. In built-in self-test mode, a pseudo-random pattern generator ("PRPG") 12 generates patterns that are applied to port ADDR of RAM 10 (random access memory) as addresses. Two address sequences, which are identical as a matter of convenience, are applied. Another pseudo-random pattern generator PRPG 14 generates patterns having a width equal to the word width of the RAM 10 (random access memory). These patterns, which are generated in two sequences, an initial sequence and then the complement of the initial sequence, are furnished as data to the DATA_IN port of the RAM 10 and are read into the RAM 10 in accordance with the respective memory address sequences furnished. The output of RAM 10, DATA_OUT, is furnished to PSA 16 (parallel signature analyzer) whose width is equal to the memory word width. PSA 16 monitors the output of the memory RAM 10 and compresses the data into a residue number known as the "signature" of the data. The signature is furnished as signal PSAQ2 to the input IN of a decoder 18. The decoder 18 contains a predetermined "known correct" signature, which is valid for a given pseudo-random pattern generator design and for a given number of clock cycles. The residue number is decoded and compared with the known correct signature in order to determine BIST pass/fail. A BIST error flag signal BEF is furnished to a chip pin by decoder 18.

In mission (normal application) mode, the address M_ADDR from the customer's application specific circuitry is furnished to the RAM 10 through address PRPG 12, and the data M_DATA_IN from the customer's application specific circuitry is furnished to the RAM 10 through data PRPG 14. Mission data M_DATA_OUT is furnished by RAM 10 to the customer's application specific circuitry through PSA 16.

The following description of the operation of the RAM with BIST 2 is based on a 256×8 bit chip-select-synchronized single port RAM macrocell such as that available from National Semiconductor Corporation and described in its ASIC Design Manual (2 micron), No. 400010, Rev. 1, 1987, pages 4–33, although it will be appreciated that RAM macrocells available from other manufacturers as well as RAM macrocells in other technologies such as bipolar and BiCMOS may be used as well.

Signal BIST_SEL selects test or mission mode, as appropriate. It is furnished from one of the pins of the ASIC chip, and is applied to control logic 20 as well as to the address PRPG 12, the data PRPG 14, the PSA 16, and the decoder 18. The operation of the RAM with BIST 2 is controlled by control logic 20. Chip select signal CS, which functions as the system clock, is furnished to control logic 20 from one of the pins of the ASIC chip.

In mission mode, signal CS is furnished on output TCLKA and applied to address PRPG 12 for clocking M_ADDR, to data PRPG 14 for clocking M_DATA_IN if signal RW asserts a write to memory, and to PSA 16 for clocking M_DATA_OUT if signal RW asserts a read from memory.

To place the RAM with BIST 2 in test mode, BIST_SEL is asserted HIGH. Control logic 20 responds by beginning the running of non-overlapping clocks TCLKA and TCLKB for clocking the address PRPG 12, the data PRPG 14, and the PSA 16 in test mode. Non-overlapping clocks are used to avoid race conditions. After the first non-overlapping clock pair, control logic 20 responds with the LOW assertion of signal INITIALIZE, which is applied to the address PRPG 12, the data PRPG 14, and the PSA 16 for resetting them to zero.

Other signals generated by control logic 20 include signal RESET, which is furnished to the address PRPG 12 and the data PRPG 14; pattern mode control bit PCB, which is furnished to the data PRPG 14; a read-/write control signal RW, which is furnished to RAM 10; and an enable signal COUNT_ENABLE, which is furnished to decoder 18. These signals are used to control a process that results in the generation of a BIST error flag signal BEF to indicate memory pass or fail, as now described.

A first memory-fill cycle in which an initial sequence of pseudo-random numbers is written into RAM 10 proceeds as follows. Control logic 20 asserts signal PCB LOW during the assertion of signal INITIALIZE to provide a seed number, in this case zero, to the data PRPG 14. The RAM 10 is put into write mode by the LOW assertion of signal RW. Address PRPG 12 and data PRPG 14 are clocked by TCLKA and TCLKB to generate at each pair of non-overlapping clocks a new pseudo-random address and new pseudo-random data, which are written into RAM 10. At the end of 513 clock pairs (the reset clock pair plus the 512 clock pairs of the first memory-fill cycle), all bits of RAM 10 contain new pseudo-random data.

A first memory-read cycle proceeds as follows. Signal RESET is asserted LOW at the end of 513 clock pairs for resetting to zero the address PRPG 12 and the data PRPG 14. Signal INITIALIZE is held HIGH, so that PSA 16 is not reset. Control logic 20 now asserts signal RW HIGH for reading data from RAM 10, and continues the running of non-overlapping clocks TCLKA and TCLKB for reading the data into PSA 16. At the end of 1025 clock pairs, all bits of RAM 10 are read from RAM 10 to PSA 16.

A second memory-fill cycle, which is performed for complete stuck-at-fault coverage, proceeds just as the first memory fill cycle described above with the following exceptions. Signal RESET is asserted LOW at the end of 1025 clock pairs for resetting to zero the address PRPG 12 and the data PRPG 14, while signal INITIALIZE is held high to avoid resetting the PSA 16. During assertion of the RESET signal, signal PCB is asserted HIGH to provide the complement of the original seed number, in this case 255, to the data PRPG 14, whereby a complemented sequence of pseudo-random numbers is written into the RAM 10 during the second memory-fill. Hence, at the end of the second memory-fill cycle after 1537 clock pairs, every word of memory is written into with both a pattern and its complement.

A second memory-read cycle proceeds just as the first memory read cycle. Signal RESET is asserted LOW at the end of clock pair 1537 for resetting to zero the address PRPG 12 and the data PRPG 14, while signal INITIALIZE is held high to avoid resetting the PSA 16.

At the end of 2049 clock pairs, a residue number representing the final signature of the test resides in PSA 16. At this time signal COUNT_ENABLE is asserted LOW, and this residue 8-bit number is gated to decoder 18. The residue number is compared with a predetermined known correct signature in decoder 18. BIST error flag BEF remains at logical 1 for a bad RAM 10, but changes to a logical 0 for a good RAM 10.

In general, the number of clock cycles needed to complete a test is given by $(8 \times 2^{}M) + 1$, where the initialize operation occurs in one clock cycle, the memory-write operation occurs in $2 \times 2^{}M$ clock cycles (the memory is written twice, as explained below), the memory-read operation occurs in $2 \times 2^{}M$ clock cycles (the memory is read twice, as explained below), the memory-write-complement operation occurs in $2 \times 2^{}M$ clock cycles, and the memory-read-complement operation occurs in $2 \times 2^{**}M$ clock cycles. Each clock cycle is a pair of non-overlapping clocks TCLKA and TCLKB.

Figure 2:
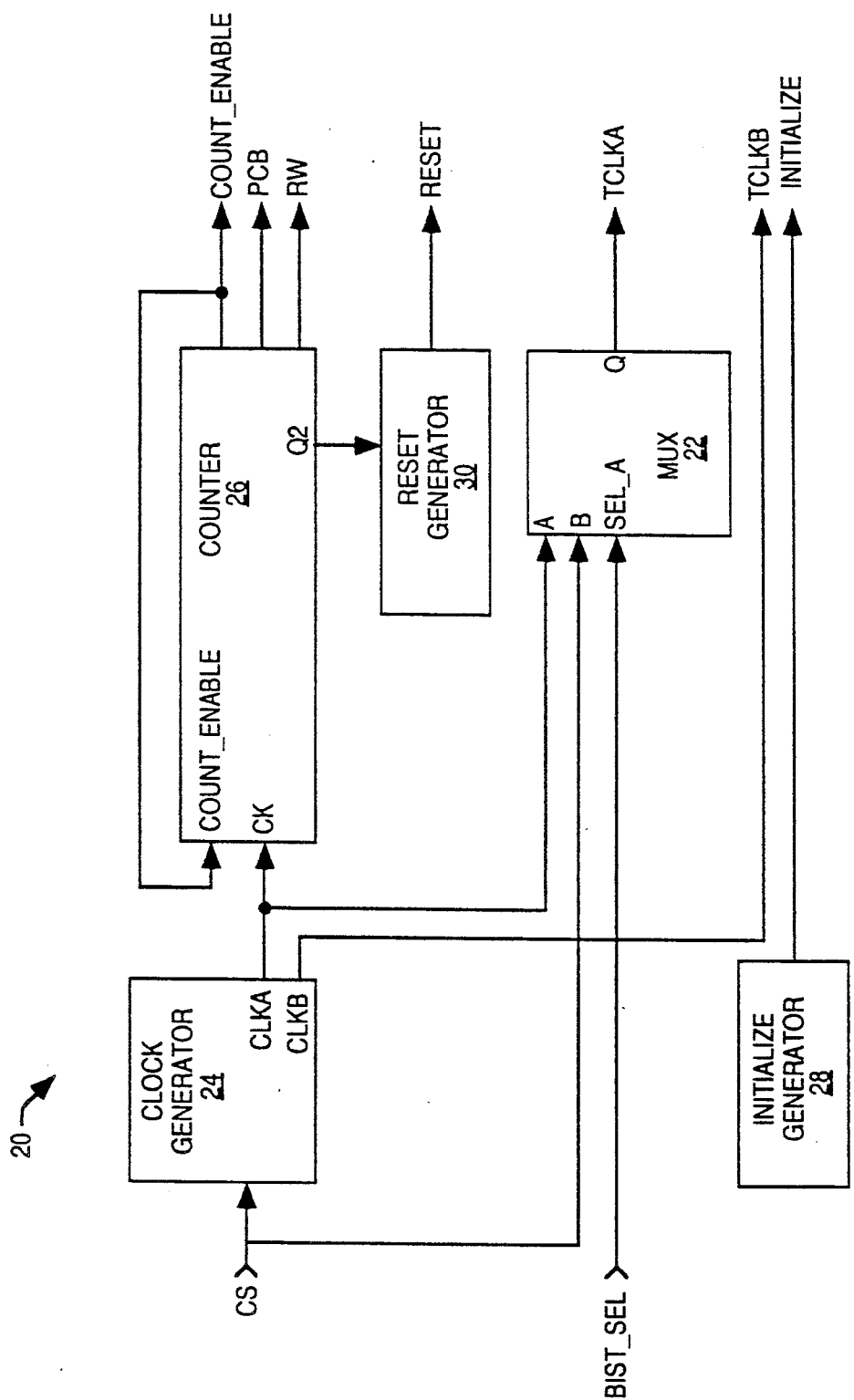
FIG. 2 is a block schematic diagram of control logic for the RAM with BIST of FIG. 1.

The control logic 20 is shown in more detail in FIG. 2. In mission mode, test select signal BIST_SEL is LOW and clock CS appears as signal TCLKA at the output of 2:1 multiplexer 22. In test mode, a HIGH assertion of BIST_SEL causes multiplexer 22 to select the clock signal output CLKA of non-overlapping clock generator 24. Clock generator 24 also produces clock signal CLKB, which is furnished as signal TCLKB. Counter 26 is clocked by the clock signal CLKA from clock generator 24 to produce three externally applied signals, signal COUNT_ENABLE, a pattern control bit signal PCB, and a read/write signal RW.

Multiplexer 22 preferably is a macrocell such as type C056/X056, which is available from National Semiconductor Corporation, Santa Clara, Calif., and described in its ASIC Design Manual, No. 400010, Rev. 1. Note that a macrocell, also known as a library element, is an elementary circuit used as a building block in the design of ASIC chips, including gate arrays and standard cells.

Figure 3:
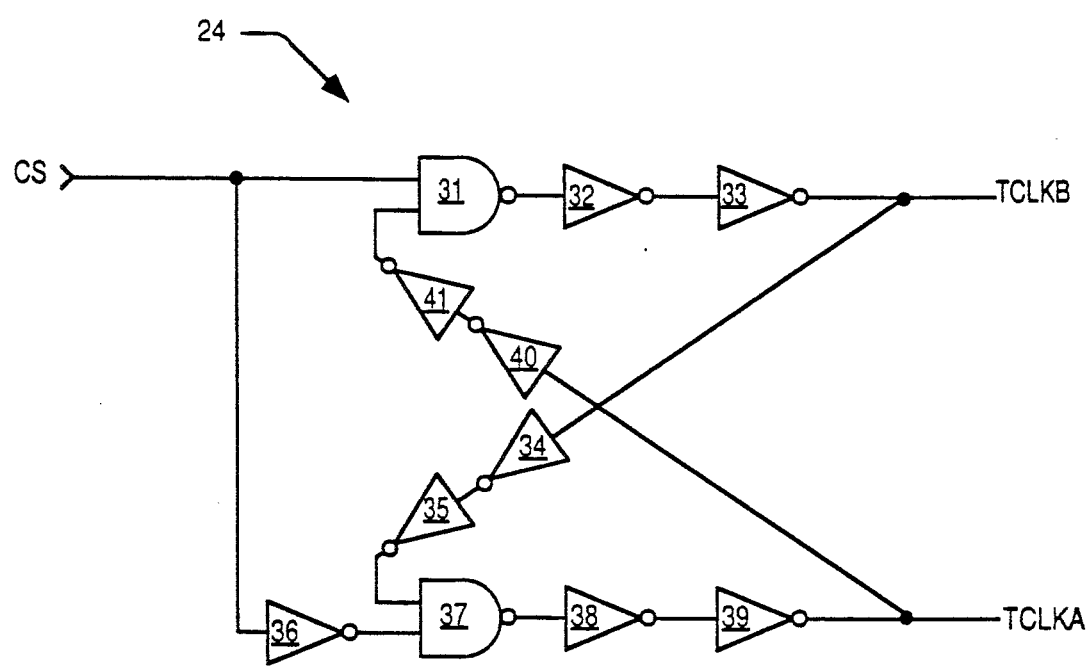
FIG. 3 is a logic schematic diagram of the clock generator of the control logic of FIG. 2.

The non-overlapping clock generator 24 of control logic 20 is shown in more detail in FIG. 3. After a transition of clock signal CS from, for example, LOW to HIGH, output CLKA first goes HIGH, then output CLKB goes LOW. After a transition of clock signal CS from HIGH to LOW, output CLKA goes LOW after output CLKB goes HIGH. Hence, clocks CLKA and CLKB are non-overlapping. The circuit operates as follows. When clock CS is HIGH, a LOW is applied through inverter 36 to the NAND gate 37. NAND gate 37 outputs a HIGH that is asserted through inverters 38 and 39 as signal CLKA. Signal CLKA also is applied through inverters 40 and to NAND gate 31, whereby the output of NAND gate 31 goes LOW and is asserted through inverters 32 and 33 as signal CLKB. Signal CLKB in turn is applied through inverters 34 and 35 to NAND gate 37, but the output of NAND gate 37 is unaffected. After the next transition of clock signal CS, which is from HIGH to LOW, the signal CLKB is made HIGH and applied to NAND gate 37 through inverters 34 and 35, whereby the signal CLKA goes LOW.

Any suitable macrocells may be used in fabricating clock generator 24, including the 2-input NAND gate type C001/X001 (31 and 37) and the inverter type C008/X008 (32-35 and 38-41), which are available from National Semiconductor Corporation, Santa Clara, Calif., and described in its ASIC Design Manual, No. 400010, Rev. 1.

The counter 26 of control logic 20 is shown in more detail in FIGS. 4A-4D. Three counter "slices" 42, 43 and 44 and associated circuitry are shown in the subcircuit 26A of FIG. 4A, although it will be appreciated that a fewer or greater number of counter slices may be appropriate. The principle, function, and design of a counter slice are described below in detail, in association with FIG. 11. Each of the counter slices 42, 43 and 44 is a 4-bit counter with an enable input TES#, a clear input CLR#, a clock input CK#, a register carry output RC#, and bits QA#, QB#, QC# and QD#. A power-on reset signal from power-on element 46 and a manual reset signal MANRESET are applied to the CLR# inputs of each of the counter slices 42, 43 and 44 through OR gate 45. Each counter slice 42, 43 and 44 also receives signal TCLKA at its clock input CK#; signal TCLKA is applied through input port CK. The counter slice having the least significant bit, counter slice 42, receives a counter enable signal COUNT_ENABLE (see FIG. 4B) at its TES# input, while each successive counter receives at its TES# input the register carry RC# output of its preceding counter. For example, output RC1 is applied to TES2, and RC2 is applied to TES3. Counter 26 functions in a conventional manner, as is well known in the art.

Any suitable macrocells may be used in fabricating the counter subcircuit 26A, including the power-on-reset-bar type PORB3 (element 46) and the 2-input OR gate type X936 (gate 45), which are available from National Semiconductor Corporation, Santa Clara, Calif., and described in its ASIC Design Manual, No. 400010, Rev. 1.

Figure 4A:
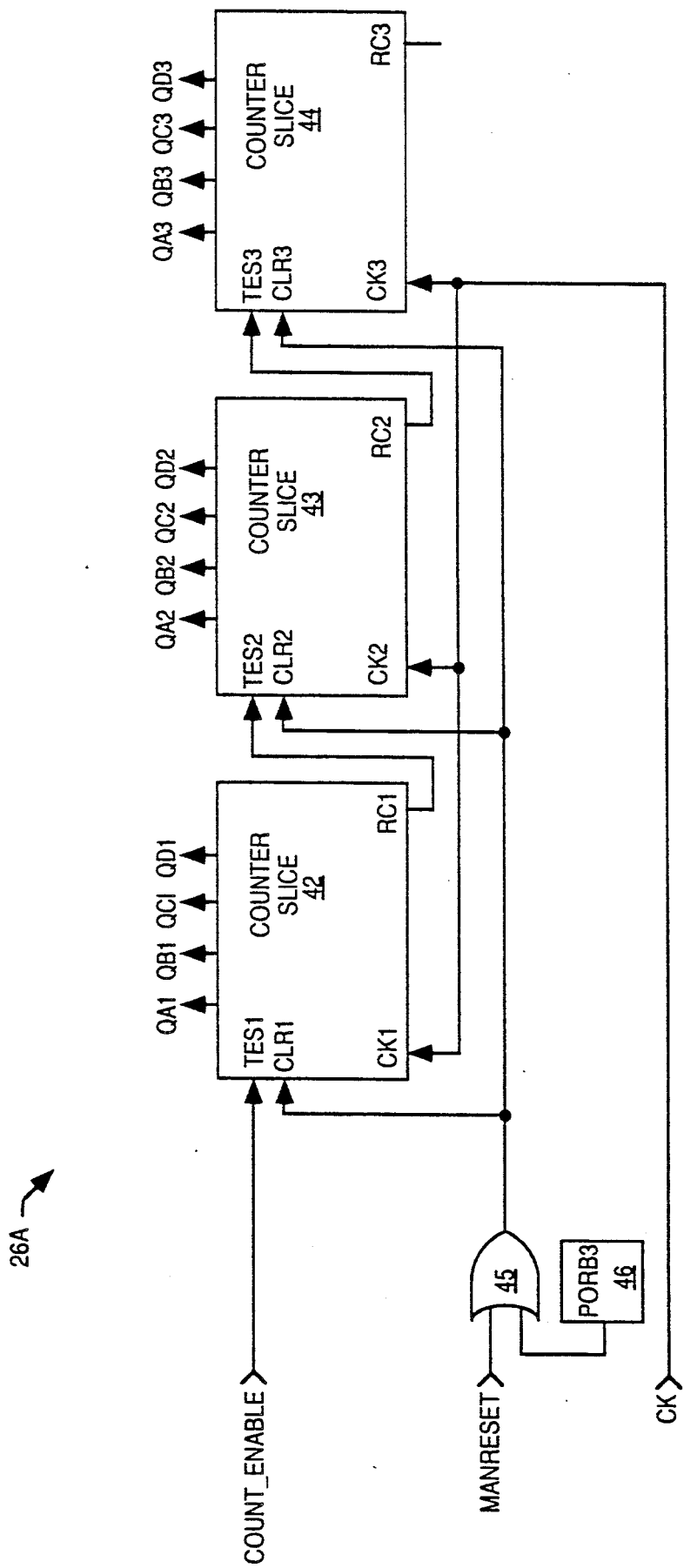
FIGS. 4A, 4B, 4C, and 4D are logic schematic diagrams of the counter of the control logic of FIG. 2.
Figure 4B:
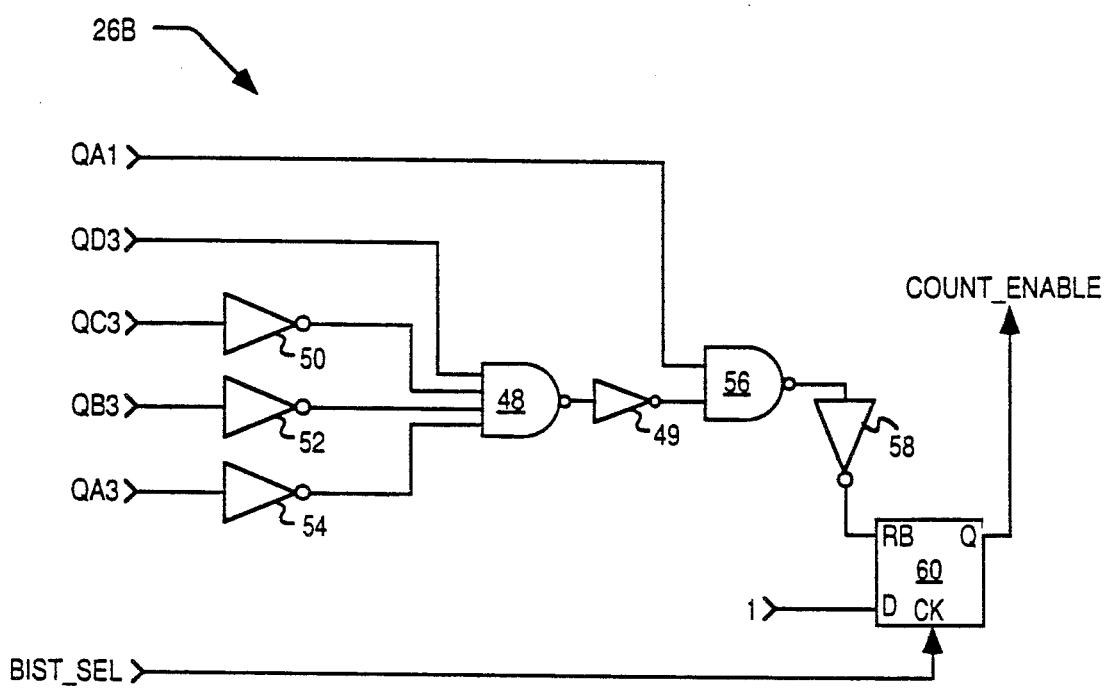

The subcircuit 26B of counter 26 which generates the signal COUNT_ENABLE is shown in FIG. 4B. The rising edge of signal BIST_SEL clocks the flipflop 60 so that the logical 1 applied at the D input initially is asserted at 16 the output Q as signal COUNT_ENABLE Signals QC3, QB3, and QA3 are inverted by respective inverters 50, 52 and 54 and applied with signal QD3 to NAND gate 48. The output of NAND gate 48 is inverted by inverter 49 and applied along with signal QA1 to NAND gate 56. The output of NAND gate 56 is inverted by inverter 58 and applied to the reset bar input port of D-flipflop 60, which is reset at a time determined in accordance with $$QA1 \cdot QA3 \cdot {}^*QB3 \cdot {}^*QC3 \cdot {}^*QD3$$

so that the output of the flipflop 60, the signal COUNT_ENABLE, goes low when the counter slices 42, 43 and 44 reach $(8\times 2^{**}M)+1$, which is at clock cycle 2049.

Any suitable macrocells may be used in the fabrication of the COUNT_ENABLE subcircuit 26B, including the 2-input AND gate type X930 (gate 56), the 4-input NAND gate type C017/X017 (gate 48), and the inverter type C008/X008 (inverters 49, 50, 52 and 54), which are available from National Semiconductor Corporation, Santa Clara, Calif., and described in its ASIC Design Manual, No. 400010, Rev. 1.

Figure 4D:
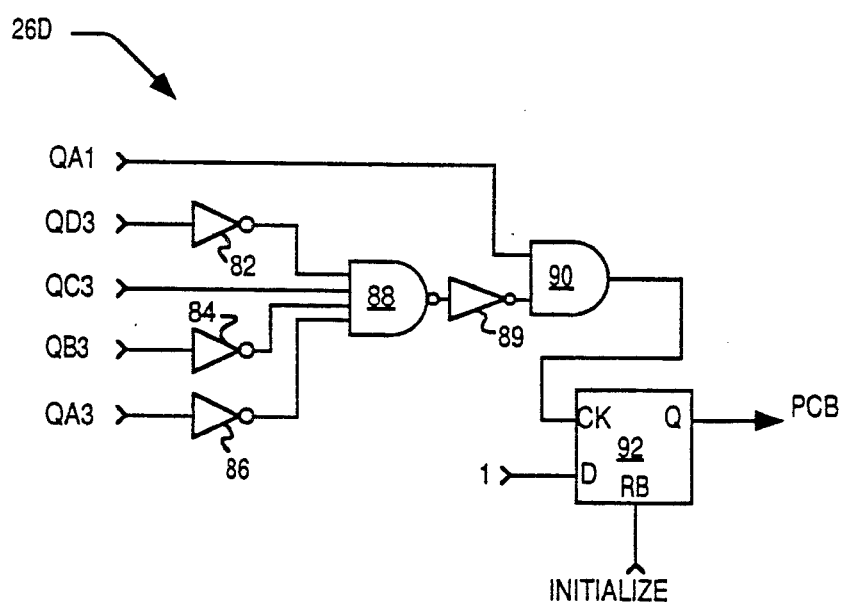
Figure 4C:
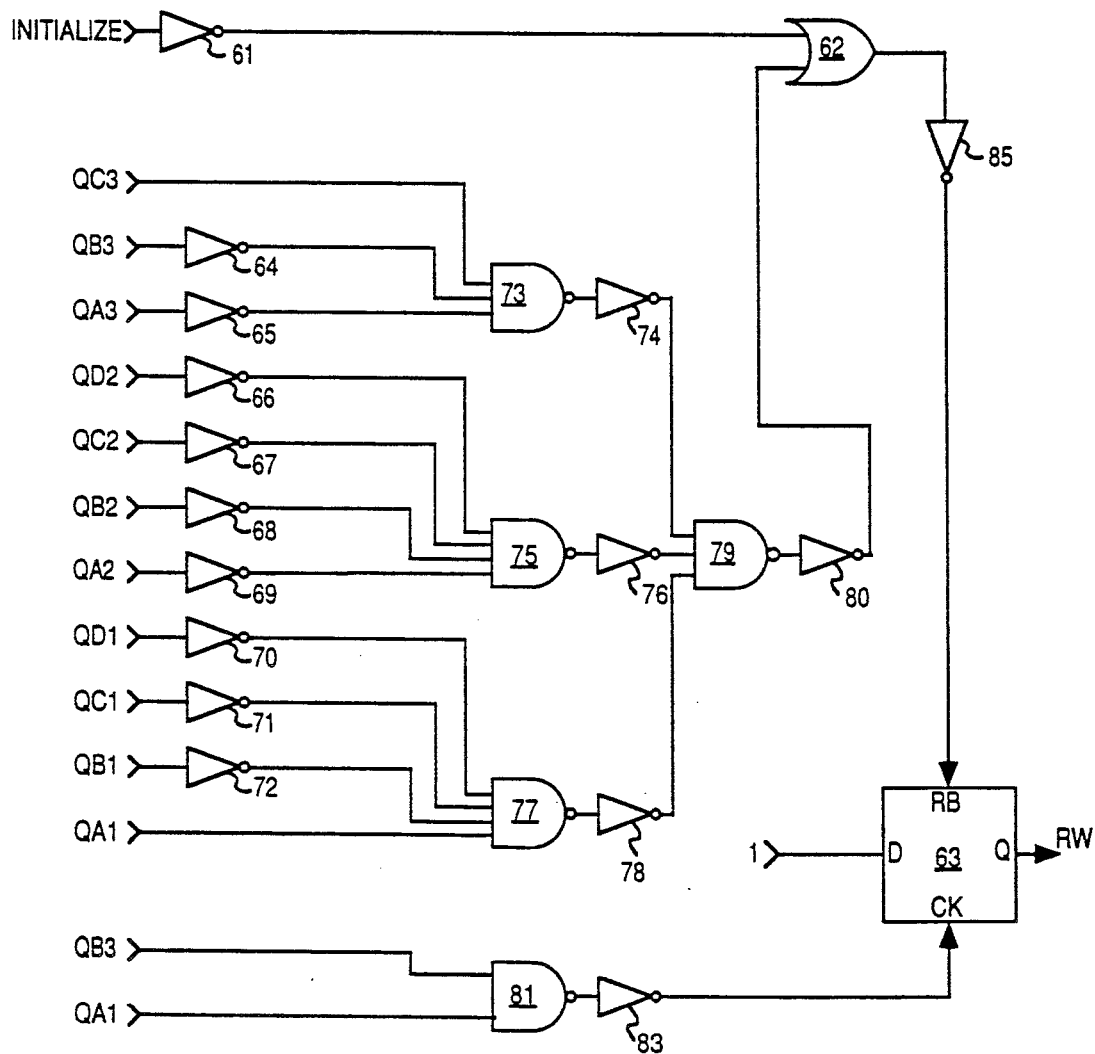

The subcircuit 26C of counter 26 which generates the signal RW is shown in FIG. 4C. At clock cycle 1, signal INITIALIZE, which is inverted by inverter 61 and applied through OR gate 62 and inverter 85 to the reset bar input RB of flipflop 63, resets the flipflop 63. The signal RW taken from output Q of flipflop 63 goes LOW, signaling a write operation At clock cycle 513, the signal at input CK of flipflop 63 transitions from LOW to HIGH, thereby clocking the logical 1 at input D to the output Q. Accordingly, signal RW goes HIGH, signaling a read operation The input CK is obtained from the inverted (gate 83) output of the NAND gate 81, to which signals QB3 and QA1 are applied. At clock cycle 1025, another signal at input RB of flipflop 63 resets the flipflop 63 to signal a write operation. This signal at RB is obtained from determining QC3*QB3/*QA3/ from inverter 64–65, NAND gate 73, and inverter 74; QD2/*QC2/*QB2/*QA2/ from inverters 66–69, NAND gate 75, and inverter 76; and QD1/*QC1/*QB1/*QA1 from inverters 70–72, NAND gate 77, and inverter 78; and applying the outputs of inverters 74, 76 and 78 to NAND gate 79, the output of which is inverted in inverter 80 and applied to input RB of flipflop 63 through OR gate 62 and inverter 85. At clock cycle 1537, the signal at input CK of flipflop 63 transitions from LOW to HIGH, thereby clocking the logical 1 at input D to the output Q. Accordingly, signal RW goes HIGH, signaling a read operation. The input CK is obtained as discussed above.

Any suitable macrocells may be used in the fabrication of RW subcircuit 26C, includinq 2-input NAND gate type C001/ X001 (gate 81), 3-input NAND gate type C002/X-002 (gates 73 and 79), 4-input NAND gate type C017/X017 (gates 75 and 77), inverter type C008/X008 (inverters 61, 64–72, 74, 76, 78, 80, 83 and 85), 2-input OR gate type X936 (gate 62), and the D-flipflop with reset bar type X970 (flipflop 63), which are available from National Semiconductor Corporation, Santa Clara, Calif., and described in its ASIC Design Manual, No. 400010, Rev. 1.

The subcircuit 26D of counter 26 which generates the pattern control bit signal PCB is shown in FIG. 4D. Signals QD3, QB3, and QA3 are inverted by respective inverters 82, 84 and 86 and applied with signal QC3 to NAND gate 88. The output of NAND gate 88 is inverted by inverter 89 and applied along with signal QA1 to AND gate 90. The output of AND gate 90, the state of which is determined in accordance with

QA1*QA3/*QB3/*QC3*QD3/ and makes a transition to logical 1 at clock cycle 1025, is applied to the clock port CK of delay flipflop 92, which has a logical 1 signal applied to its D input port and signal INITIALIZE applied to its reset bar port. Accordingly, signal PCB, which is taken from the output of the flipflop 92, is a logical zero until the counter slices 42, 43 and 44 reach $(4\times 2^{**}M)+1$, at which time it becomes a logical one.

Any suitable macrocells may be used in the fabrication of the PCB subcircuit 26D, including the 2-input AND gate type X930 (gate 90), the 4-input NAND gate type C017/X017 (gate 88), the inverter type C008/X008 (inverters 82, 84, 86 and 89), and the delay flipflop with reset bar type X970 (flipflop 92), which are available from National Semiconductor Corporation, Santa Clara, Calif., and described in its ASIC Design Manual, No. 400010, Rev. 1.

Figure 5:
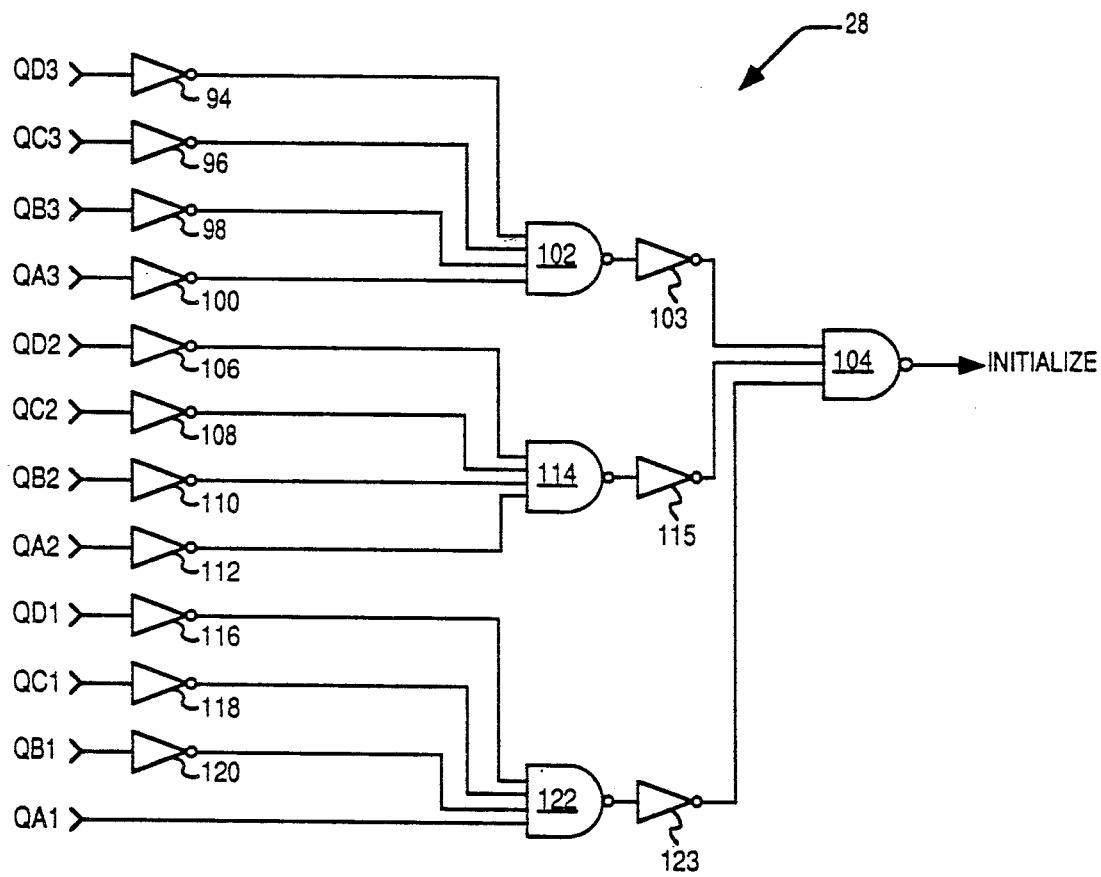
FIG. 5 is a logic schematic diagram of the initialize generator of FIG. 2.

The initialize generator 28 of control logic 20 is shown in more detail in FIG. 5. Signals QD3, QC3, QB3 and QA3 are inverted by respective inverters 94, 96, 98, and 100 and applied to NAND gate 102. Signals QD2, QC2, QB2 and QA2 are inverted by respective inverters 106, 108, 110, and 112 and applied to NAND gate 114. Signals QD1, QC1, and QB1 are inverted by respective inverters 116, 118 and 120 and applied along with signal QA1 to NAND gate 122. The outputs of NAND gates 102, 114 and 122 are inverted by respective inverters 103, 115 and 123, and applied to NAND gate 104, the output of which is signal INITIALIZE. Reset generator 28 implements the equation:

((QA1*QB1/*QC1/*QD1/)*(QA2/*QB2/*QC2/*QD2/)
*(QA3/*QB3/*QC3/*QD3/))/ hence generates a pulse at count 1.

Any suitable macrocells may be used in the fabrication of initialize generator 28, including the 3-input NAND gate type C002/X002 (gate 104), the 4-input NAND gate type C017/X017 (gates 102, 114, and 122), and the inverter type C008/X008 (inverters 94, 96, 98, 100, 103, 106, 108, 110, 112, 115, 116, 118, 120, and 123), which are available from National Semiconductor Corporation, Santa Clara, Calif., and described in its ASIC Design Manual, No. 400010, Rev. 1.

Figure 6:
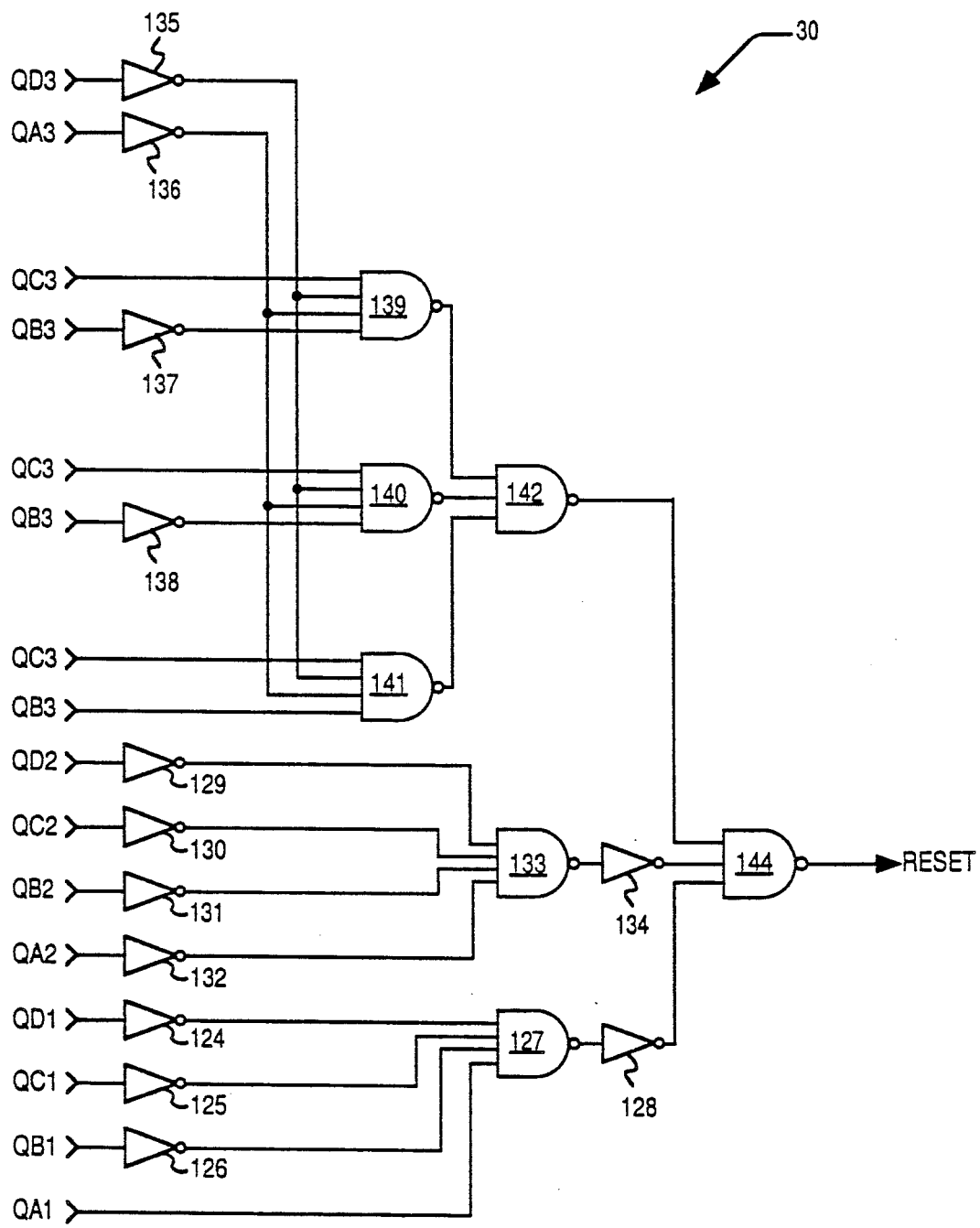
FIG. 6 is a logic schematic diagram of the reset generator of FIG. 2.

The reset generator 30 of control logic 20 is shown in more detail in FIG. 6. Signals QD1, QC1, and QB1 are inverted by respective inverters 124, 125, and 126 and applied along with signal QA1 to NAND gate 127. Signals QD2, QC2, QB2 and QA2 are inverted by respective inverters 129, 130, 131 and 132, and applied to NAND gate 133. Signals QD3, QC3, QB3 and QA3 are inverted by respective inverters 135, 136, 137 and 138. Signals QD3, QC3, QB3 and QA3/ are applied to NAND gate 139; signals QD3, QC3, QB3/ and QA3/ are applied to NAND gate 140; and signals QD3, QC3, QB3, and QA3/ are applied to NAND gate 141. The outputs of NAND gates 139, 140 and 141 are applied to NAND gate 142. The outputs of NAND gates 127 and 133 are inverted by respective inverters 128 and 134, and applied with the output of NAND gate 142 to NAND gate 144, the output of which is the signal RESET. The RESET circuit 30 of generator 30 implements the NOT of (QA1*QB1/*QC1/*QD1/)*QA2/*QB2/*QC2/*QD2/)*
((QA3/*QB3*QC3/*QD3/)+(QA3/*QB3/*QC3*QD3/)+
(QA3/*QB3*QC3*QD3/))

thereby generating a pulse to reset the address PRPG 12 and the data PRPG 14 when the counter 26 is at 513, at 1025, and at 1537.

Any suitable macrocells may be used for fabricating the reset generator 30, including the 3-input NAND gate type C002/X002 (gates 142 and 144), the 4-input NAND gate type C017/X017 (gates 127, 133, 139, 140, and 141), and the inverter type C008/X008 (inverters 124–126, 129–132, and 135–138), which are available from National Semiconductor Corporation, Santa Clara, Calif., and described in its ASIC Design Manual, No. 400010, Rev. 1.

Figure 8:
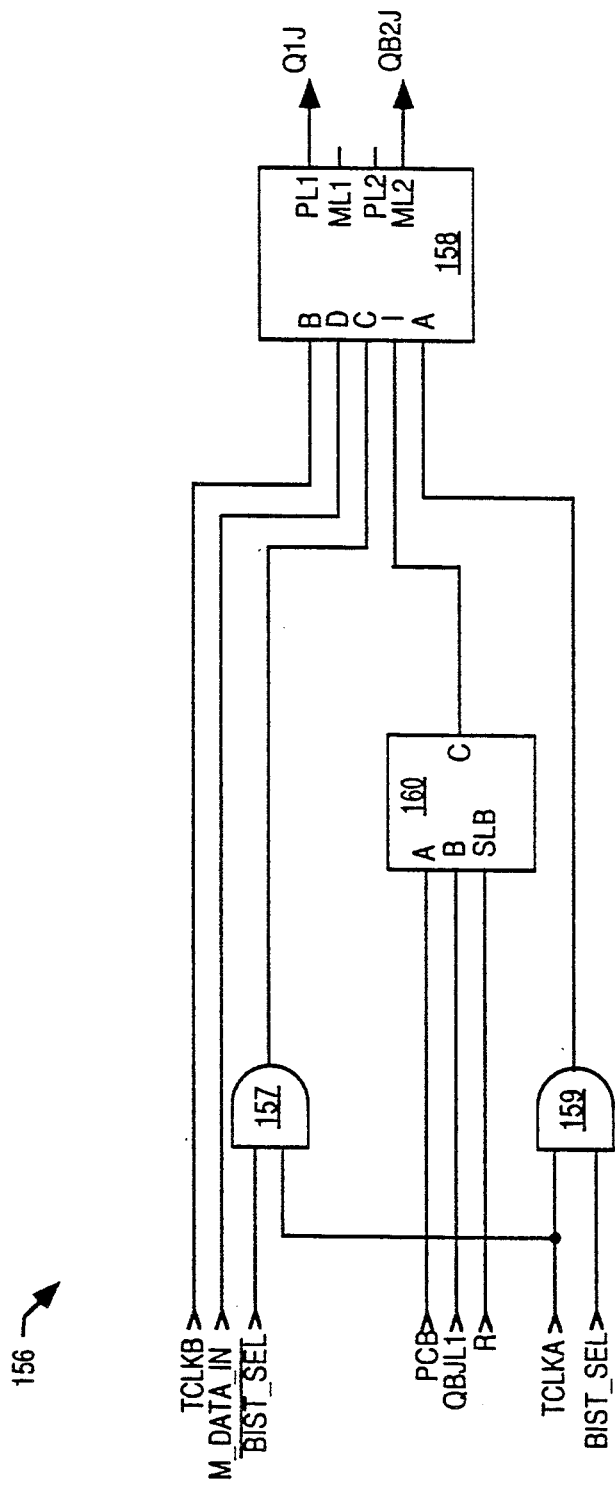
FIG. 8 is a logic schematic diagram of a data slice.
Figure 9:
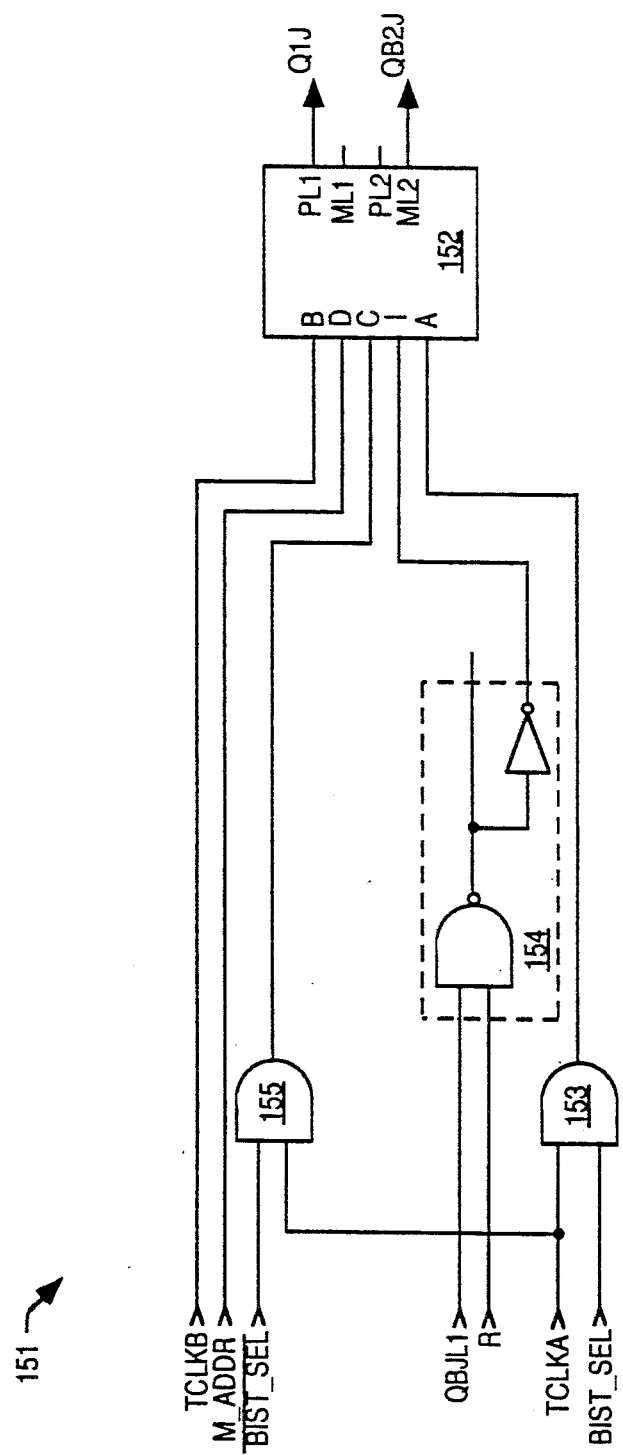
FIG. 9 is a logic schematic diagram of an address slice.
Figure 10:
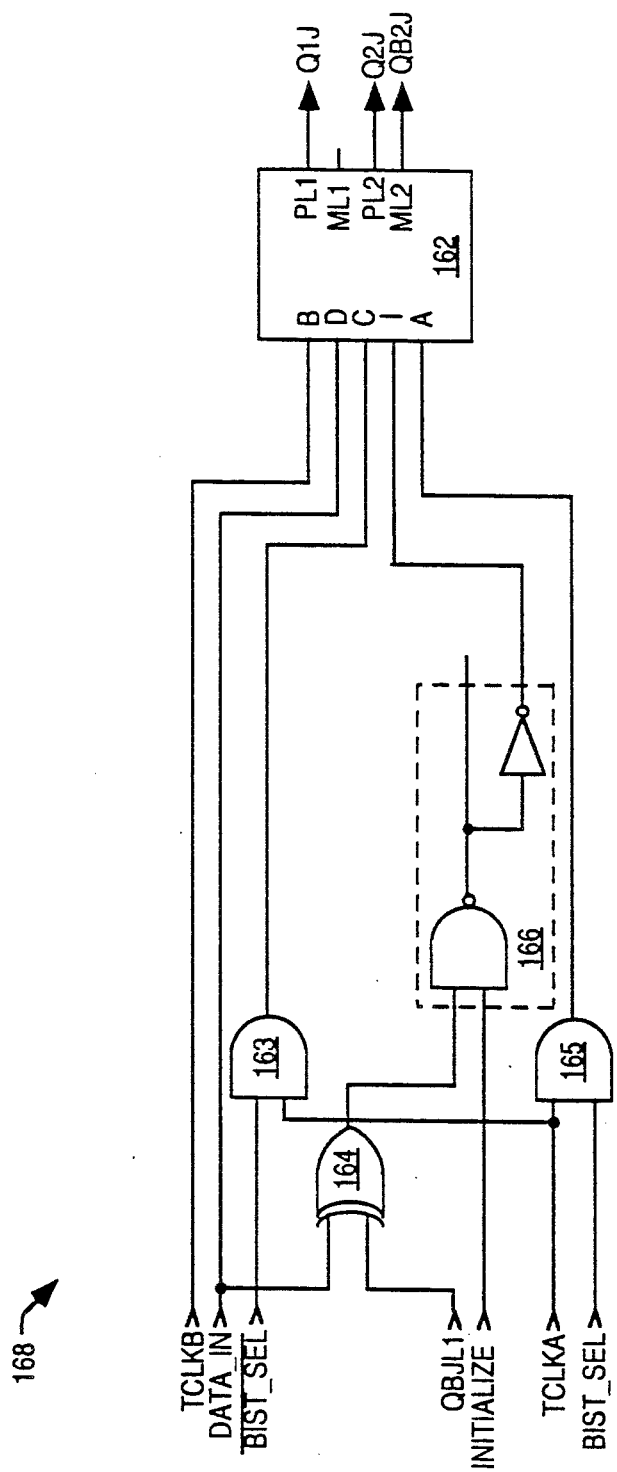
FIG. 10 is a logic schematic diagram of a PSA slice.
Figure 11:
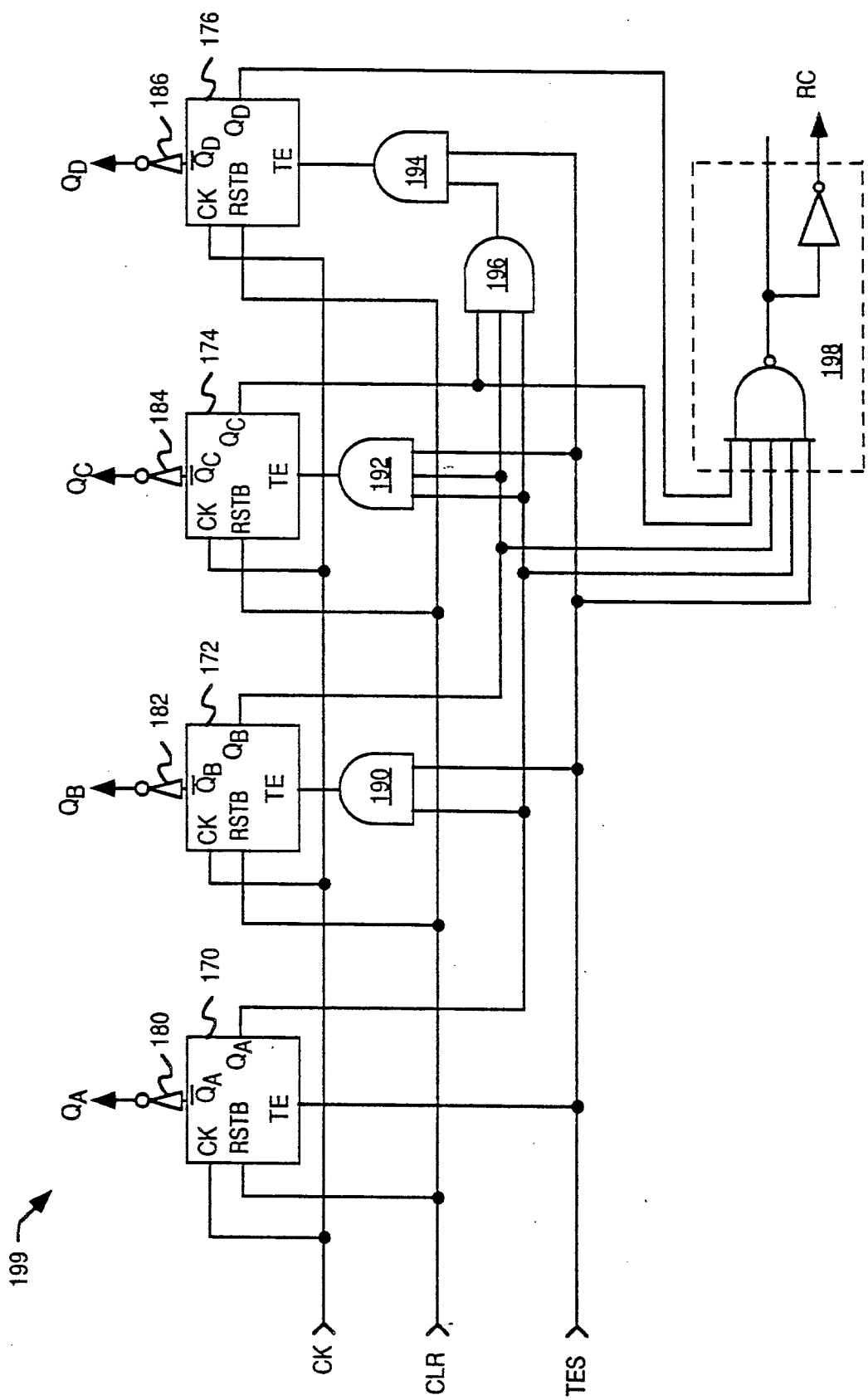
FIG. 11 is a logic schematic diagram of a counter slice.

Certain of the BIST circuits, specifically the address PRPG 12, the data PRPG 14, the PSA 16, and the counter 26, are made by a "slice" technique. In accordance with this technique, a basic circuit known as a "slice" is provided for each of these BIST circuits. An illustrative data slice 156 for the data PRPG 14 is shown in FIG. 8, an illustrative address slice 151 for the address PRPG 12 is illustrated in FIG. 9, an illustrative PSA slice 168 for the PSA 16 is illustrated in FIG. 10, and an illustrative counter slice 199 is shown in FIG. 11. The slice is reproduced as many times as required; see text associated with Table 1 below.

Figure 7:
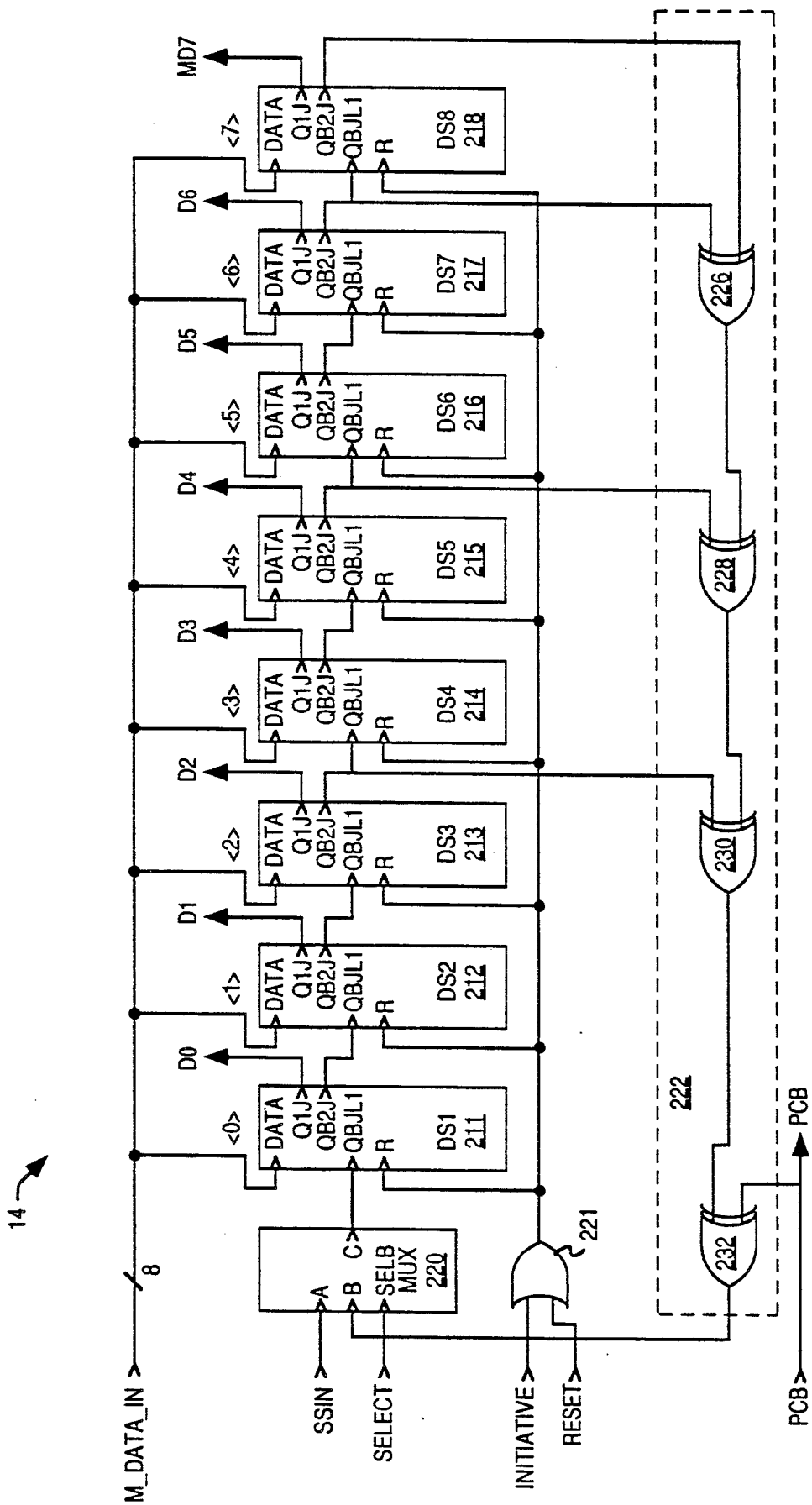
FIG. 7 is a block schematic diagram of the data PRPG of FIG. 1.

In the case of the address PRPG 12, the data PRPG 14, and the PSA 16, feedback logic is used. An example of the feedback logic for the 8-bit data PRPG 14 is shown in FIG. 7. The feedback logic for the address PRPG 12 and the PSA 16 is formed in similar fashion, although as explained below, the width of the address PRPG 12 is one bit greater than the minimum as discussed below. The feedback path for a number of different bit sizes is determined in accordance with Table 1. The slice technique can readily be implemented either manually or on a general purpose computer running a silicon compiler.

Depending on the number of words and the width of the RAM 10, different sizes of certain of the BIST elements address PRPG 12, data PRPG 14, PSA 16, and counter 26 are needed. In the following discussion, the configuration of the RAM 10 is N×M, where N is the number of words and M is the number of bits per word.

The width of the data PRPG 14 and the PSA 16 need be only M bits.

The width of address PRPG 12 is selected preferably to be A+1 bits, where 2**A=N. The use of an additional bit in the width of address PRPG 12 ensures that all address location numbers are obtained. As in the case of the data PRPG 14 and the PSA 16, an initial number known as the "seed" number is applied to the pseudo-random pattern generator. The purpose of the seed number is to condition the pseudo-random pattern generator into a specific pattern. A property of the pseudo-random pattern generators used for the address PRPG 12, the data PRPG 14, and the PSA 16 is that for a given circuit implementation, here 8-bits, and for a given seed number, here zero and subsequently its complement 255, of the 256 numbers generated, only 255 are unique. While this property is acceptable for the data PRPG 14 and the PSA 16, it would result in the omission of one word from the BIST operation. Accordingly, in a 256×8 bit RAM embodiment, nine slices are used in constructing the address PRPG 12 and one bit is ignored for addressing purposes. Of the 512 numbers generated, 511 are unique. As only eight of the nine bits are used for addressing purposes, 256 unique addresses are obtained (each address at least once) during the generation of the 512 numbers.

The width of the counter 26 must be sufficient to count at least up to the number of clock cycles needed to complete a memory test, which generally is (8×2**M)+1 as previously discussed. Note that each counter slice 42, 43 and 44 is four bits wide (see FIG. 11), although other widths could be used if desired.

With respect to address PRPG 12, data PRPG 14, and PSA 16, the various configurations are implemented by taking the outputs of the different stages of a linear feed-back shift register and applying them to the beginning of the linear feed-back shift register in an appropriate manner. If the beginning stage of the linear feed-back register is considered to be stage 1, the next stage is stage 2, and so forth, then the feedback logic for any configuration can be implemented in accordance with Table 1.

TABLE 1

| Stages | Sequence Length | Take Feed-backs From |
|---|---|---|
| 2 | 3 | 1 and 2 |
| 3 | 7 | 2 and 3 |
| 4 | 15 | 3 and 4 |
| 5 | 31 | 3 and 5 |
| 6 | 63 | 5 and 6 |
| 7 | 127 | 6 and 7 |
| 8 | 255 | 3, 5, 7, and 8 |
| 9 | 511 | 5 and 9 |
| 10 | 1023 | 7 and 10 |
| 11 | 2047 | 9 and 11 |
| 12 | 4095 | 6, 8, 11, and 12 |
| 13 | 8191 | 9, 10, 12, and 13 |
| 14 | 16,383 | 4, 8, 13, and 14 |
| 15 | 32,767 | 14 and 15 |
| 16 | 65,535 | 4, 13, 15, and 16 |
| 17 | 131,071 | 14 and 17 |
| 18 | 262,143 | 11 and 18 |
| 20 | 1,048,575 | 17 and 20 |
| 21 | 2,097,151 | 19 and 21 |
| 22 | 4,194,303 | 21 and 22 |
| 23 | 8,338,607 | 18 and 23 |
| 24 | 16,766,977 | 19 and 24 |
| 25 | 33,551,431 | 22 and 25 |
| 26 | 67,074,001 | 21 and 26 |
| 27 | 133,693,177 | 19 and 27 |
| 28 | 268,435,455 | 25 and 28 |
| 29 | 536,870,911 | 27 and 29 |
| 30 | 1,073,215,489 | 28 and 30 |

Consider, for example, the 8-bit data PRPG 14 of FIG. 7. The data PRPG 14 has eight data stages DS1–DS8 (elements 211–218) forming a linear feedback shift register with a sequence length of 255 steps. As RAM 10 contains 256 words, one data word will not be unique. If desired, a nine stage data PRPG could be used.

Each stage comprises a single slice (detailed in FIG. 8) with inputs DATA and QBJL1 and outputs Q1J and QB2J. The output QJ1 is obtained from the DATA port and furnished as a data bit (e.g. bit D0 of DS1 211 is obtained from M_DATA_IN0), and the output QB2J is supplied as an input to the next slice in order (e.g. QB2J of DS1 211 is furnished to the QBJL1 input port of DS2 212). Certain signals such as the clock signals, the BIST_SEL signal, and a pattern control bit PCB signal are omitted from FIG. 7 to preserve clarity, but are discussed in association with the data slice of FIG. 8.

The input to the first stage of the linear feedback register (e.g. DS1 211) is from multiplexer 220, which selects either a serial seed number SSIN at port A or the output of feedback circuit 222, as determined by signal SELECT applied to port SELB. Signal SSIN may be used to set the seed number to any desired value. As the seed number of zero is acceptable, the seed number is established simply by resetting the data PRPG 14 with signal INITIALIZE or RESET, as appropriate, through OR gate 221. As signal SSIN is not used, signal SELECT is tied to logical 1.

In accordance with Table 1, the outputs QB2J of the third data stage 212, the fifth data stage 214, the seventh data stage 216, and the eighth data stage 217 are furnished to the feedback circuit 222. The output QB2J of DS7 217 is EXORed with the output QB2J of DS6 216 in gate 226, the output QB2J of DS4 214 is EXORed with the output of gate 226 in gate 228, the output QB2J of DS2 212 is EXORed with the output of gate 228 in gate 230, and the output of gate 230 is EXORed with the signal PCB in gate 232 and furnished to port B of multiplexer 220.

Any suitable macrocells may be used in the fabrication of the feedback path 222, including the 2-input OR gate type X936 (gate 221), the 2-input exclusive OR gate type C053/X053 (gates 226, 228, 230 and 232), and the 2 to 1. multiplexer type C056/X056 (multiplexer 220), which are available from National Semiconductor Corporation, Santa Clara, Calif., and described in its ASIC Design Manual, No. 400010, Rev. 1.

Except for the differences in the respective slice designs, the address PRPG 12 differs only slightly from the data PRPG 14. Its size is 9-bits rather than 8-bits; hence, its feedback path is the exclusive OR of the outputs of stages five and nine. It does not use signal PCB, and M_ADDR rather than M_DATA_IN is applied.

Except for the differences in the respective slice designs, the PSA 16 differs only slightly from the data PRPG 14. It does not use signal PCB, and SIGNATURE rather than M_DATA_IN is applied. Only signal INITIALIZE, rather than INITIALIZE+RESET, is used to reset the PSA 16.

The data slice 156 of FIG. 8 includes a multiplexed delay flipflop 158 and a 2 to 1 multiplexer 160. Three clocks are applied to flipflop 158. One of the clocks, clock CS, appears as signal TCLKA when BIST_SEL is LOW. Signal BIST_SEL complement controls AND gate 157, through which clock CS is applied to port C of flipflop 158 for clocking a respective bit of M_DATA_IN applied at port D to the output PL1 as signal Q1J. Another clock, first test clock CLKA, appears as signal TCLKA when BIST_SEL is HIGH. Signal BIST_SEL controls AND gate 159, through which clock CLKA is applied to port A of flipflop 158 for clocking test data furnished by multiplexer 160 and applied at port I to the output PL1 as signal Q1J. When signal R (which is INITIALIZE+RESET) applied to port SLB of multiplexer 160 is asserted, signal QBJL1 is selected and made available at output C. Otherwise, signal PCB is selected and made available at output C. In implementing a two-phase, non-overlapping clock technique, a third clock, second test clock TCLKB, is applied to port B for controlling the complemented output ML2, which is provided as signal QB2J.

Suitable macrocells for use in fabricating data slice 156 include type C063 (flipflop 158), type C056/X056 (multiplexer 160), and type X930 (AND gates 157 and 159), which are available from National Semiconductor Corporation, Santa Clara, Calif., and described in its ASIC Design Manual, No. 400010, Rev. 1.

The address slice 151 of FIG. 9 includes multiplexed D flipflop 152 and a two input NAND gate with complement 154 Three clocks are applied to flipflop 152. One of the clocks, clock CS, appears as signal TCLKA when BIST_SEL is LOW. Signal BIST_SEL complement controls AND gate 155, through which clock CS is applied to port C of flipflop 152 for clocking a respective bit of M_ADDR applied at port D to the output PL1 as signal Q1J. Another clock, first test clock CLKA, appears as signal TCLKA when BIST SEL is HIGH. Signal BIST_SEL controls AND gate 153, through which clock CLKA is applied to port A of flipflop 152 for clocking a test address QBJL1*R furnished by complemented NAND gate 154 and applied at port I to the output PL1 as signal Q1J. In implementing a two-phase, non-overlapping clock technique, a third clock, second test clock TCLKB, is applied to port B for controlling the complemented output ML2.

Suitable macrocells for use in fabricating address slice 151 include type C063 (flipflop 152), type C003/X003 (complemented NAND gate 154), and type X930 (AND gates 151 and 153), which are available from National Semiconductor Corporation, Santa Clara, Calif., and described in its ASIC Design Manual, No. 400010, Rev. 1.

The PSA slice 168 of FIG. 10 includes a multiplexed D flipflop 162, a 2 input exclusive-OR 164, and a two input NAND gate with complement 166. Three clocks are applied to flipflop 162. One of the clocks, clock CS, appears as signal TCLKA when BIST_SEL is LOW. Signal BIST_SEL complement controls AND gate 163, through which clock CS is applied to port C of flipflop 162 for clocking a respective bit of SIGNATURE applied at port D to the output PL1 as signal Q1J. Another clock, first test clock CLKA, appears as signal TCLKA when BIST_SEL is HIGH. Signal BIST_SEL controls AND gate 165, through which clock CLKA is applied to port A of flipflop 162 for clocking the signal furnished by the complemented NAND gate 166 and applied at port I to the output PL1 as signal Q1J. The output of the complemented NAND gate 166 is (INITIALIZE)*(QBJL1(+)SIGNATURE) (where * is the logical AND operator and (+) is the logical exclusive-OR operator), which is obtained from signal INITIALIZE applied to one input of the complemented NAND gate 166, and signal QBJL1(+)DATA from EXOR 164 applied to the other input of the complemented NAND gate 166. In implementing a two-phase, non-overlapping clock technique, a third clock, second test clock TCLKB, is applied to port B for controlling the complemented output ML2.

Suitable macrocells include type C063 (flipflop 162), type C053/X053 (EXOR gate 164), type C003/X003 (gate 166), and type X930 (AND gates 163 and 165), which are available from National Semiconductor Corporation, Santa Clara, Calif., and described in its ASIC Design Manual, No. 400010, Rev. 1.

The 4-bit counter slice 199 of FIG. 11 included four flipflops 170, 172, 174 and 176, which are clocked by signal CLKA (FIG. 4A) applied to their respective CK ports, and reset by manual reset signal MANRESET or a power-on-reset signal (FIG. 4A) applied as signal CLR to their respective RSTB ports. After assertion of signal CLR, outputs QA, QB, QC and QD of flipflops 170, 172, 174 and 176 respectively are reset to the value 0. For application to other circuits, signals QA, QB, QC and QD are obtained from QA/, QB/, QC/ and QD/ inverted through inverters 180, 182, 184 and 186 respectively.

Counting is initiated when signal COUNT_ENABLE, applied as signal TES, is asserted HIGH. Bit QA of flipflop 170 toggles at each rising edge of signal CK so long as signal TES is asserted HIGH, as signal TES is applied to the TE port of flipflop 170. Bit QB of flipflop 172 toggles one clock after QA goes HIGH so long as signal TES is asserted HIGH, as the signal QA*TES is applied to the TE port of flipflop 172 through AND gate 190. Bit QC of flipflop 174 toggles one clock after both QA and QB go HIGH so long as signal TES is asserted HIGH, as the signal QA*QB*TES is applied to the TE port of flipflop 174 through AND gate 192. Bit QD of flipflop 176 toggles one clock after QA, QB and QC go HIGH so long as signal TES is asserted HIGH, as the signal QA*QB*QC*TES is applied to the TE port of flipflop 176 through AND gates 194 and 196. A ripple carry signal RC equal to TES*QA*QB*QC*QD is obtained from complemented NAND gate 198.

Suitable macrocells for use in fabricating the counter slice 199 include type C036 (flipflops 170, 172, 174, 176), type C008/X008 (inverters 180, 182, 184, 186), type C057 (complemented NAND gate 198), type X930 (AND gates 190, 194) and type X931 (AND gates 192, 196), which are available from National Semiconductor Corporation, Santa Clara, Calif., and described in its ASIC Design Manual, No. 400010, Rev. 1.

Figure 12:
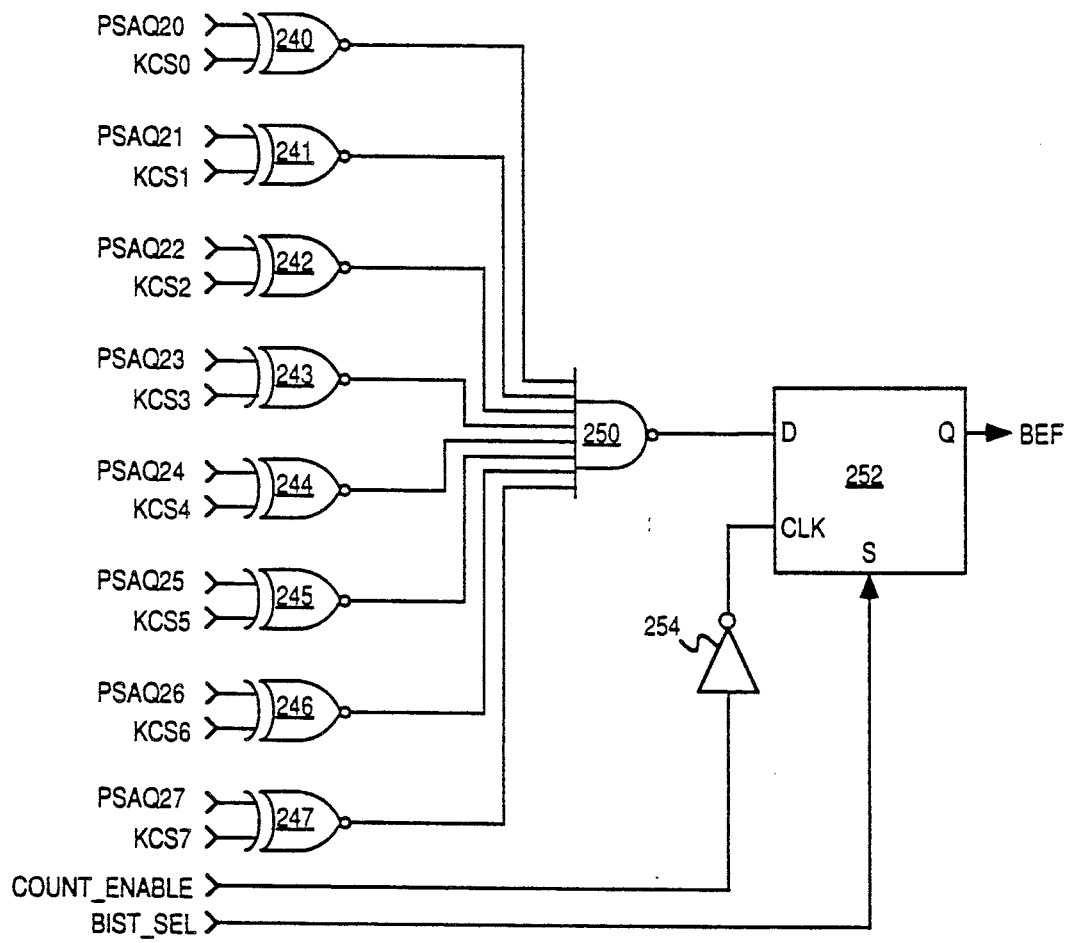
FIG. 12 is a logic schematic diagram of the decoder of FIG. 1.

The signature determined by PSA 16 is furnished to decoder 18, which is shown in detail in FIG. 12. The eight bits of the signature, PSAQ20-PSAQ27, are taken from the output signals Q2J of the PSA slices 168, and applied to respective exclusive NOR gates 240–247. The eight bits of the known correct signature, KCS0–KCS7, also are applied respectively to the exclusive NOR gates 240–247. Note that for any given word size, the known correct signature can readily be determined by simulating the appropriate data PRPG and PRDG determined in accordance with Table 1. The output of each of the EX-NOR gates 240–247 is applied to an 8-input NAND gate 250, the output of which is logical 0 for a good RAM and logical 1 for a bad RAM. This value is clocked into flipflop 252 by a suitable transition of signal COUNT_ENABLE, which is applied through inverter 254. The flipflop 252 is set to logical 1 at the initiation of test mode by signal BIST_SEL, and upon a transition in signal COUNT_ENABLE, either remains logical 1 to indicate a bad RAM, or transitions to logical 0 to indicate a good RAM.

Any suitable macrocells may be used in the fabrication of the decoder 18, including 2-input exclusive-NOR gate type C048/X048 (gates 240–247), 8-input NAND gate type C830/X830 (gate 250), D-flipflop with set type X973 (flipflop 252), and inverter type C008/X008, which are available from National Semiconductor Corporation, Santa Clara, Calif., and described in its ASIC Design Manual, No 400010, Rev. 1.

While our invention has been described with respect to the embodiments set forth above, other embodiments and variations not described herein are within the scope of our invention. For example, our invention should not be limited to any specific word size, memory size, or address size. Nor should our invention be limited to any particular fabrication technology, although CMOS macrocells are used in the embodiments described above. Accordingly, other embodiments and variations not described herein are to be considered within the scope of our invention as defined by the following claims.

What is claimed is:

1. An integrated circuit self-testing memory having a clock input, a BIST (built-in self test) select input, and a BIST error flag output, comprising:
a random access memory;
an address PRPG (pseudo-random pattern generator) connected to said memory by a parallel address bus, said address PRPG comprising:
  a plurality of substantially identical successively arranged address PRPG slices, said address PRPG slices having respective test address inputs obtained for each of said address PRPG slices other than a first one of said address PRPG slices from an output of an immediately preceding one of said address PRPG slices, and
  an address PRPG feedback circuit having an output connected to an input of said first address PRPG-slice, and having inputs respectively connected to ones of said address PRPG slices;
a data PRPG connected to said memory by a parallel data input bus, said data PRPG comprising:
  a plurality of substantially identical, successively arranged data PRPG slices, said data PRPG slices having respective test data inputs obtained for each of said data PRPG slices other than a first one of said data PRPG slices from an output of an immediately preceding one of said data PRPG slices, and
  a data PRPG feedback circuit having an output connected to an input of said first data PRPG slice, and having inputs respectively connected to outputs of selected ones of said data PRPG slices;
a PSA (parallel signature analyzer) PRPG connected to said memory by a parallel data output bus, said data PRPG comprising:
  a plurality of substantially identical, successively arranged PSA PRPG slices, and PSA PRPG slices having respective data inputs obtained from respective bits of said memory, and further having respective test signature inputs obtained for each of said PSA PRPG slices other than a first one of said PSA PRPG slices from an output of an immediately preceding one of said PSA PRPG slices;
  a parallel signature output bus comprising outputs of said PSA PRPG slices; and
  a PSA PRPG feedback circuit having an output connected to an input of said first PSA PRPG slice, and having inputs respectively connected to outputs of selected ones of said PSA PRPG slices;
a decoder containing a predetermined known correct signature, said decoder having an input connected to said signature output bus for comparing a determined signature on said signature output bus with said known correct signature and setting the BIST error flag output to indicate memory pass/fail; and
control logic connected to the BIST select input and the clock input, and having output control lines connected to said address PRPG, said data PRPG, said PSA PRPG, and said decoder for controlling the operation thereof and for providing a seed number to said data PRPG.

2. A BIST memory as in claim 1, wherein:
said control logic includes a counter responsive to said clock signal for counting clock cycles, said counter comprising a plurality of substantially identical, successively arranged counter slices with each of said counter slices other than a first one of said counter slices receiving a register carry bit from a preceding one of said counter slices; and said control logic is responsive to a state of said counter for placing control signals on said output control lines.

3. A BIST memory as in claim 2, wherein each of said counter slices comprises a counter of a preselected number of bits.

4. A BIST memory as in claim 1, wherein said control logic generates a pattern control bit signal PCB, said data PRPG being responsive to said PCB upon reset/initialize for applying said seed number to said data PRPG, said seed number being a preselected number for a first state of said PCB signal, and the complement of said preselected number for a second state of said PCB signal.

5. A BIST memory as in claim 4, wherein said control logic furnishes a read/write signal RW to said memory for controlling first write and read cycles and second write and read cycles, said PCB signal being at said first state at the start of said first write cycle, and being at said second state at the start of said second write cycle.

6. A BIST memory as in claim 4, wherein each of said data slices comprises:
a delay flipflop; and
a multiplexer for applying signal PCB to said delay flipflop during a reset/initialize cycle, and otherwise applying the respective test data input to said delay flipflop.

7. A BIST memory as in claim 1, wherein:
the slices of said address PRPG are provided with respective mission address bits on respective mission address inputs thereof, and furnish mission address bits on respective outputs in responsive to one state of said test select signal, and furnish test address bits on respective outputs in response to another state of said test select signal;
the slices of said data PRPG are provided with respective mission data bits on respective mission data inputs thereof, and furnish mission data bits on respective outputs in responsive to one state of said test select signal, and furnish test data bits on respective outputs in response to another state of said test select signal; and
the slices of said PSA PRPG are provided with respective memory data bits on respective mission data inputs thereof, and furnish memory data bits on respective outputs in responsive to one state of said test select signal, and furnish signature data bits on respective outputs in response to another state of said test select signal.

8. A BIST memory as in claim 7, wherein said address slice comprises:
a multiplexed flipflop having a respective one of said mission address inputs applied to a first input thereof, said first input being clocked by a mission clock signal during one state of said test select signal; and
an AND gate for applying a seed number to a second input of said multiplexed flipflop during a reset/initialize cycle, and otherwise applying said respective mission address input to said second input, said second input being clocked by a test clock signal during a second state of said test select signal.

9. A BIST memory as in claim 7, wherein said control generates a pattern control bit signal PCB, said data PRPG being responsive to said PCB signal upon reset/initialize for applying said seed number to said data PRPG, said seed number being a preselected number for a first state of said PCB signal, and the complement of said preselected number for a second state of said PCB signal; said data PRPG comprising:
a multiplexed flipflop having a respective one of said mission data inputs applied to a first input thereof, said first input having and clocked by a mission clock signal during one state of said test select signal; and
a multiplexer for applying signal PCB to a second input of said multiplexed flipflop during a reset/initialize cycle, and otherwise applying said respective mission data input to said second input, said second input being clocked by a test clock signal during a second state of said test select signal.

10. A BIST memory as in claim 7, wherein said PSA slice comprises:
a multiplexed flipflop having a respective one of said memory data inputs applied to a first input thereof, said first input being clocked by a mission clock signal during one state of said test select signal; and
an exclusive-OR gate having said respective test signature input and said respective memory data input applied thereto; and
an AND gate for applying a seed number to a second input of said multiplexed flipflop during a reset/initialize cycle, and otherwise applying the output of said exclusive-OR gate to said second input, said second input being clocked by a test clock signal during a second state of said test select signal.

11. A BIST memory as in claim 1, wherein the number of data PRPG stages and the number of PSA PRPG stages are both equal to the number of bits in a memory word.

12. A BIST memory as in claim 11, wherein the number of address PRPG stages is given by the expression $A+1$, wherein $2**A$ equals the number of words in said memory.

13. A BIST memory as in claim 1, wherein the number of address PRPG stages is given by the expression $A+1$, wherein $2**A$ equals the number of words in said memory.

14. A method for designing a built-in self test circuit for an integrated circuit memory having an address bus of a preselected width and a data bus of a preselected width, comprising the steps of:
replicating an address slice a selected number of times in accordance with the width of said address bus;
serially interconnecting said replicated address slices to form an address PRPG (pseudo-random pattern generator), said replicated address slices forming the respective stages thereof and providing test address bits to said memory on their respective outputs;
providing a feedback signal to the first stage of said address PRPG, said feedback signal being determined from outputs of selected stages of said address PRPG;
replicating a data slice a selected number of times in accordance with the width of said data bus;
serially interconnecting said replicated data slices to form a data PRPG, said replicated data slices forming the respective stages thereof and providing test data bits to said memory on their respective outputs;
providing a feedback signal to the first stage of said data PRPG, said feedback signal being determined from outputs of selected stages of said data PRPG;

replicating a PSA (parallel signature analyzer) slice a selected number of times in accordance with the width of said data bus;

serially interconnecting said replicated PSA slices to form a PSA PRPG, said replicated PSA slices forming the respective stages thereof, and receiving on inputs thereof respective data bits from said memory, and providing signature bits on their respective outputs;

providing a feedback signal to the first stage of said PSA PRPG, said feedback signal being determined from outputs of selected stages of said PSA PRPG; and providing a known correct signature for comparison with said signature bits to determine memory pass-/fail.

15. A method as in claim 14, wherein the size of said memory is N words by M bits per word, and wherein:

said address slice replicating step comprises replicating said address slice A+1 times, where A is given by 2**A=N;

said data slice replicating step comprises replicating said data slice M times; and said PSA slice replicating step comprises replicating said PSA slice M times.

* * * * *